United States Patent [19]

Kawanishi et al.

[11] Patent Number: 4,829,531
[45] Date of Patent: May 9, 1989

[54] EXTERNAL RESONATOR TYPE SEMICONDUCTOR LASER

[75] Inventors: Hidenori Kawanishi, Higashiosaka; Osamu Yamamoto, Nara; Nobuyuki Miyauchi, Tenri; Shigeki Maei, Yamatokoriyama; Hiroshi Hayashi, Kyoto, all of Japan

[73] Assignee: Sharp Kabushiki Kaisha, Osaka, Japan

[21] Appl. No.: 82,659

[22] Filed: Aug. 7, 1987

[30] Foreign Application Priority Data

Aug. 9, 1986 [JP] Japan ................. 61-187597

[51] Int. Cl.$^4$ ............ H01S 3/098; H01S 3/04; H01S 3/19; H01S 3/08
[52] U.S. Cl. ............................ 372/19; 372/34; 372/36; 372/29; 372/48; 372/49; 372/92; 372/99
[58] Field of Search ............... 372/19, 36, 34, 29, 372/32, 48, 49, 99, 43, 92, 50

[56] References Cited

U.S. PATENT DOCUMENTS 4,592,060  5/1986  Hayakawa et al. ............... 372/36

FOREIGN PATENT DOCUMENTS 3410729  9/1985  German Democratic Rep. ... 372/43
0130187  7/1985  Japan ................................... 372/49

Primary Examiner—William L. Sikes
Assistant Examiner—Georgia Y. Epps
Attorney, Agent, or Firm—Birch, Stewart, Kolasch & Birch

[57] ABSTRACT

The external resonator type semiconductor laser of the present invention includes a semiconductor laser element, a reflection member having a reflecting mirror surface for feeding back to the laser element a laser beam emitted from an emitting end surface of the semiconductor laser element, and a mount member for fixedly mounting the laser element and reflection member thereon. The coefficient of linear expansion of the mount member is adapted to be smaller than the coefficient of linear expansion of the semiconductor laser element and reflection member so that the distance between the emitting surface and the reflecting surface (i.e. the external resonator length) decreases with a rise in temperature.

10 Claims, 6 Drawing Sheets

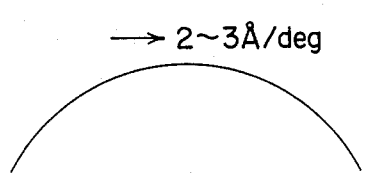
FIG. 7(a)
CONVENTIONAL ART
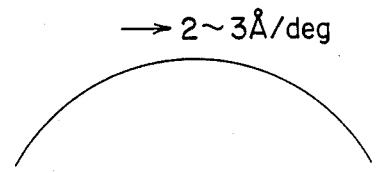
FIG. 8(a)
FIG. 8(b)
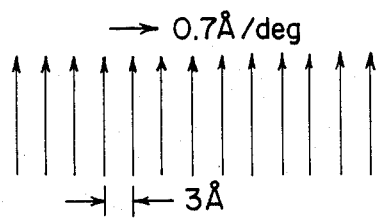
FIG. 7(b)
CONVENTIONAL ART
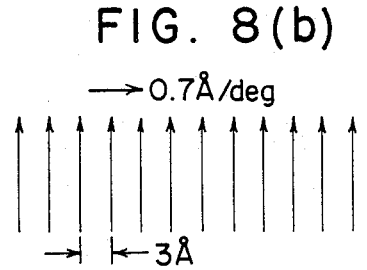
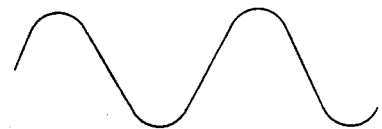
FIG. 8(c)
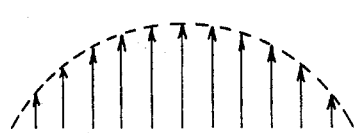
FIG. 7(c)
CONVENTIONAL ART
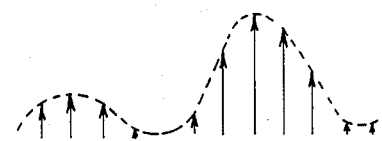
FIG. 8(d)

EXTERNAL RESONATOR TYPE SEMICONDUCTOR LASER

BACKGROUND OF THE INVENTION

The present invention relates to an external resonator type semiconductor laser in which a laser beam emitted from the semiconductor laser is adapted to be fed back to the same by means of an external reflection member (mirror).

The oscillatory axial mode in a semiconductor laser has here to for been selected according to gain distribution in the laser medium and the transparency characteristic of the laser resonator. FIG. 7 is a diagram schematically showing selectivity of the oscillatory axial mode in a conventional semiconductor laser, FIG. 7(a) showing gain distribution in the laser medium against wavelength (the abscissa), FIG. 7(b) showing a spectrum of the axial modes against wavelength, and FIG. 7(c) showing a spectrum in a superradiant state in which the above graphs (a) and (b) are superposed on each other. Of the axial modes in the laser, the one having the wavelength closer to the peak (the maximum value) in the gain distribution obtains the maximum gain and becomes the oscillatory axial mode. However, when the environmental temperature changes, the wavelength of the peak in the gain distribution shifts toward the higher wavelength side at the rate of 2-3 Å/deg because the band gap in the semiconductor is varied. Meanwhile, the refractive index of the medium is varied and also the laser element itself exhibits thermal expansion thereby changing the effective optical length of the laser resonator. As a result, the axial modes shift toward the higher wavelength side at the rate of approximately 0.7 Å/deg, maintaining approximately 3 Å of spacings therebetween. Thus, as the temperature rises from a point, since the amount of the variation of the gain distribution is larger than the amount of the variation of the axial modes, the oscillatory wavelength shows a continuous variation for a while but soon it exhibits a mode hopping, and thereafter, it repeats continuous variation and mode hopping, and thereby, stepped variations as shown in FIG. 9 are caused. Besides, the wavelength is also changed by the magnitude of the current for driving the semiconductor laser. Such variations have hitherto been hindrances to development of the applications of the semiconductor lasers to uses such as a laight source for wavelength-multiplex optical communications or high-resolution spectroscopy of which a bright future is expected.

A SEC. laser (Short External Cavity Laser diode) has been invented which is adapted such that an emitted beam from the semiconductor laser is fed back by means of an external mirror to the main body of the semiconductor laser, and in this arrangement, the oscillatory axial mode is selected according to three factors, i.e., the ordinary laser gain distribution, the laser axial mode, and wavelength selectivity by the external resonator. The relative situation is schematically shown in FIG. 8 in correspondence with FIG. 7. FIG. 8(a) shows the gain distribution in the laser medium against wavelength (the absciosa), FIG. 8(b) shows a spectrum of the axial modes against wavelength, FIG. 8(c) shows a resonance characteristic of the external resonator against wavelength, and FIG. 8(d) shows the spectrum in a superradiant state in which the above (a), (b), and (c) are superposed. The envelope of the spectrum in the superradiant state, is different from that in FIG. 7, and has ripples as shown in FIG. 8(d). In this case, since the temperature characteristic of the peak of the envelope is controllable by changing the length of the external resonator, i.e., the length of the gap between the semiconductor laser and the external mirror, it becomes possible to suppress the mode hopping.

Typical examples of characteristics against temperature of the oscillatory wavelength of the SEC laser are shown in FIGS. 10(a), (b), and (c), in any of which the same axial modes are maintained within the temperature range $\Delta t$, whereas, within the temperature range $\Delta T$, the axial modes in the same mountain in the envelope of the spectrum as shown in FIG. 8(d) each successively acquire the maximum gain to become the oscillatory axial mode, and when the range $\Delta T$ is exceeded, the oscillatory axial mode shifts to the peak of the next mountain in the envelope and thereupon exhibits a large mode hop. As to $d\bar{\lambda}/dT$ representing the temperature coefficient of the wavelength of the peak of the envelope as shown in FIG. 8(d) and $\alpha$ representing the temperature coefficient of the axial modes as shown in FIG. 8(b), FIG. 10(a) shows such a state when $d\bar{\lambda}/dT < \alpha$ of the oscillatory axial mode successively shifting to the adjoining axial mode on the side toward shorter wavelengths and producing small mode hops within the range $\Delta T$, whereas FIG. 10(b) shows such a state when $d\bar{\lambda}/dT = \alpha$, then $\Delta T$ becoming $\Delta T = \Delta t$, of the same only producing a large mode hop. Further, FIG. 10(d) shows such a state when $d\bar{\lambda}/dT > \alpha$ of the oscillatory axial mode successively shifting to the adjoining axial mode on the side toward longer wavelengths and producing small mode hops.

The conventional SEC laser is constructed of a VSIS type semiconductor laser having a GaAs.GaAlAs.DH (double hetero) structure on a GaAs substrate and a GaAs chip provided with an $Al_2O_3$ coating serving as a total reflection mirror, both being fixed on a mount made of Cu at a predetermined external resonator distance (the distance between the emitting end surface of the semiconductor laser and the reflecting mirror surface). An example of the relationship between the external resonator distance L of the SEC laser and the temperature range $\Delta T$, as shown in FIGS. 10(a), (b), and (c), is indicated by a curve (C) in FIG. 4. And at this time, the temperature coefficient $d\bar{\lambda}/dT$ of the wavelength of the peak of the envelope of the spectrum has a characteristic against L as shown by a curve C in FIG. 5. From these FIGS. $\Delta T < 35°$ C. is obtainded for $L > 50$ $\mu$m and $\Delta T > 35°$ C. is obtained for $L < 50$ $\mu$m, but when $\Delta T > 35°$ C., the variation of the oscillatory wavelength becomes as large as shown in FIG. 10(c). Therefore, to widen the range $\Delta T$ and reduce the variation of the oscillatory wavelength in such case, it has so far been practiced to set $d\bar{\lambda}/dT$ to agree with the temperature coefficient of the axial modes so that a characteristic as shown in FIG. 10(b) is obtained.

Therefore, when the setting is made to $L = 50$ $\mu$m to make $d\bar{\lambda}/dT$ coincident with the temperature coefficient (0.7 Å/deg) of the axial modes, it is achieved to suppress the mode hopping over the temperature range $\Delta T = 35°$ C., but the variation of the oscillatory wavelength in the range $\Delta T$ becomes as large as 35° C. ×0.7 Å/°C. = 24.5 Å.

SUMMARY OF THE INVENTION

The present invention has been made in view of such a situation and a primary object of this invention is the provision of an external resonator type semiconductor laser capable of suppressing the variation of the oscillatory wavelength and making $\Delta T$ still larger.

FIG. 1 is an explanatory drawing showing structure of the present invention, in which 101 denotes a semiconductor laser element, 102 denotes a reflection member having a reflecting surface 102a for feeding back the laser beam emitted from the emitting surface 101a at one end of the semiconductor laser element to the semiconductor laser element 101, 103 denotes a mount member for fixedly mounting the semiconductor laser element 101 and the reflection member 102 thereon, L denotes the distance between the emitting end surface 101a and the reflecting surface 102a, i.e., the external resonator length, $L_1$ denotes the distance between centers of the semiconductor laser element 101 and the reflection member 102, $L_2$ denotes the distance from the center of the semiconductor laser element 101 to the emitting end surface 101a, and $L_3$ denotes the distance from the center of the reflection member 102 to the reflecting surface 102a, and the coefficient of linear expansion of the mount member 103 is adapted to be smaller than the coefficient of linear expansion of the semiconductor laser element 101 and reflection member 102 so that the external resonator length L may decrease with a rise in temperature.

In the arrangement of FIG. 1, when the coefficient of linear expansion of the mount member 103 is larger than the coefficient of linear expansion of the semiconductor laser element 101 and reflection member 102, the distance L increases as the temperature rises because expansion of the distance $L_1$ becomes larger than expansion of the distance $(L_2+L_3)$. When, conversely, the coefficient of linear expansion of the mount member 103 is smaller than that of the semiconductor laser element 101 and reflection member 102, the distance L decreases as the temperature rises because expansion of the distance $(L_2+L_3)$ becomes larger than that of the distance $L_1$.

Now, the temperature coefficient $d\lambda/dT$ of the wavelength $\lambda$ of the peak in the resonance characteristic of the external resonator (refer to FIG. 8(c)) is generally expressed as $$\frac{d\lambda}{dT} = \frac{\lambda_0}{L_0} \cdot \frac{dL}{dT} \quad (1)$$

where $L_0$ represents the external resonator length of an arbitrary external resonator with the resonance wavelength $\lambda_0$. In the above described case where the external resonator length L decreases with a rise in temperature, i.e., where $dL/dT<0$, the following relationship is obtained from equation (1)

$$d\lambda/dT<0 \quad (2)$$

The envelope shown in FIG. 8(d) is determined by superposition of the gain distribution characteristic as shown in FIG. 8(a) and the resonance characteristic of the external resonator as shown in FIG. 8(c). Since the gain distribution characteristic shifts toward the longer wavelength side with a rise in temperature at the rate of 2-3 Å/deg as described above, when the temperature coefficient of the wavelength of the peak of the resonance characteristic of the resonator is given as $d\bar\lambda/dT>0$, the temperature coefficient $d\bar\lambda/dT$ of the wavelength of the peak of the envelope of FIG. 8(d) takes a positive value determined by the external resonator length L as shown by C in FIG. 5, for example. However, when $d\lambda/dT<0$ as given by equation (2), because then the rate of variation of the envelope of FIG. 8(d) with temperature decreases, it becomes possible to make $d\bar\lambda/dT=0$. That is, while the envelope of FIG. 8(d) is kept invariable with temperature, the oscillatory axial mode successively shifts to the adjoining axial mode on the side toward shorter wavelengths within the envelope. As a result, although small mode hops are produced, the variation in width of the wavelength is kept within the spacing between one axial mode and the next, and in addition thereto, it is made possible to take a sufficiently large temperature range $\Delta T$ wherein a large mode hop is not produced.

Therefore, the present invention has the effect to limit the variation of the oscillatory wavelength with changes in temperature to the minimum wavelength spacing between the axial modes, over a wide temperature range.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIGS. 7(a), (b), (c) are an explanatory drawing of selectivity of the oscillatory axial mode in a conventional semiconductor laser;

FIGS. 8(a), (b), (c), (d) are an explanatory drawing of selectivity of the oscillatory axial mode in an SEC semiconductor laser according to the present invention;

DESCRIPTION OF THE PREFERRED EMBODIMENTS

Figure 1:
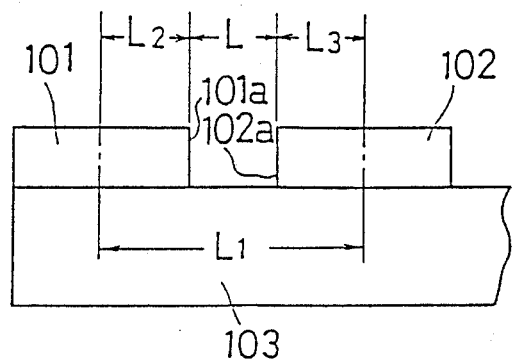
FIG. 1 is a side view showing structure of the present invention.
Figure 2:
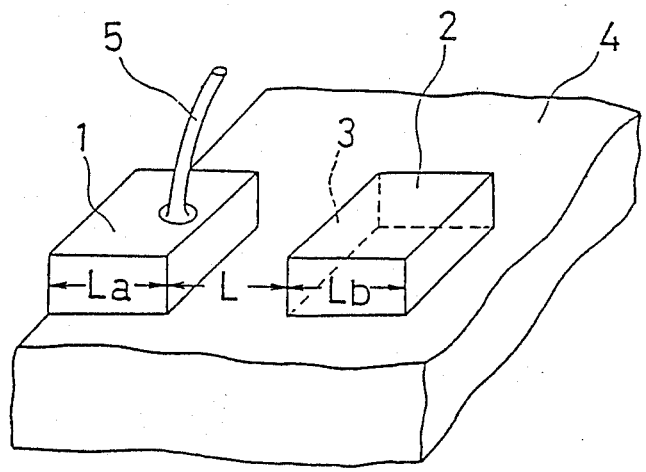
FIG. 2 is a perspective view showing an embodiment of the present invention.

FIG. 2 is a perspective view showing an embodiment of the present invention, wherein reference numeral 1 denotes a semiconductor laser of a VSIS type having a GaAS.GaAlAs double heterojunction (DH) structure disposed on a GaAs substrate, 2 denotes a GaAs chip, 3 denotes a total reflection mirror formed of an $Al_2O_3$ coating applied to one surface of the GaAs chip 2 for feeding the emitted beam back to the semiconductor laser 1 to the semiconductor laser 1, 4 denotes a mount for mounting the semiconductor laser 1 and the GaAs chip 2 thereon, 5 denotes a lead wire for supplying current to the semiconductor laser 1, La denotes the length of the semiconductor laser 1, Lb denotes the length of the chip 2, and L denotes the distance from the emitting surface of the semiconductor laser 1 to the reflecting surface of the mirror 3 (external resonator length).

Figure 3:
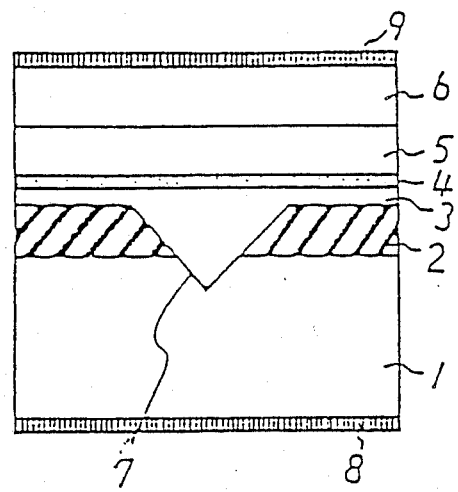
FIG. 3 is a view showing a sectional structure of a VSIS type semiconductor laser element as a constituent of the present invention.

FIG. 3 is a view showing a sectional structure of the VSIS type semiconductor laser element having the above mentioned double heterojunction structure.

In order to form a current-confining stripe structure on a p-type GaAs substrate 1, a current limiting layer 2 of n-type GaAs is grown on the substrate, and then, a V groove is made by etching from the surface of the current limiting layer 2 such that the bottom of the groove reaches the GaAs substrate 1. Over the V groove and the current limiting layer 2, a multilayer crystal structure for laser resonance of a double heterojunction structure consisting of a p-type clad layer 3 of GaAlAs, an active layer 4 of GaAlAs or GaAs, an n-type clad layer 5 of GaAlAs is deposited, and further thereon, an n-type cap layer 6 of GaAs is deposited by continuous liquid phase epitaxial growth. Since the current limiting layer 2 is connected in a opposite conductive type to the injection current, there is flown no current in this region, but a current path 7 is formed in the region of the V groove where the current limiting layer 2 is removed and current is allowed to flow in a concentrated manner. The GaAs substrate 1 and the cap layer 6 are provided by evaporation with an electrode 8 for the p side and an electrode 9 for the n side, respectively.

Figure 10A:
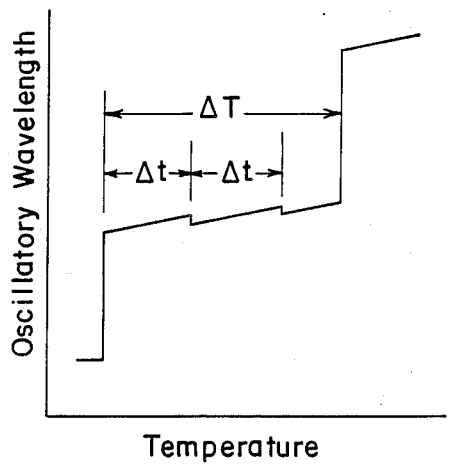
FIGS. 10(a), (b), and (c) are graphs showing various temperature characteristics of the oscillatory wavelength in a general SEC semiconductor laser.
Figure 10B:
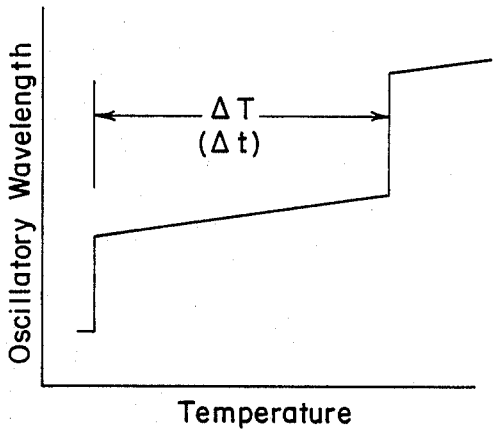
Figure 10C:
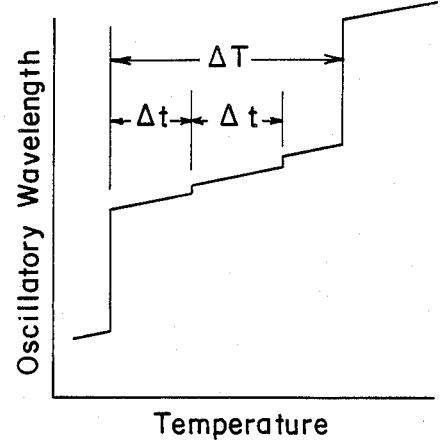

In the structure as shown in FIG. 2, the mount 4 is made of Si which has a coefficient of linear expansion $(2.4 \times 10^{-6} \deg^{-1})$ smaller than the coefficient of linear expansion of GaAs $(5.9 \times 10^{-6} \deg^{-1})$ as the material forming semiconductor laser element 1 and the chip 2, and while its size is made to be 1.5 mm×3.0 mm×1.0 mm (thick), the length of the semiconductor laser element 1 is made as La=250 μm and the length of the chip 2 is made as Lb=500 μm. With such arrangement made, $\Delta T$ (FIG. 10) and $d\bar{\lambda}/dT$ relative to the external resonator length L were measured. The measurement results are shown by A in FIG. 4 and A in FIG. 5.

Figure 4:
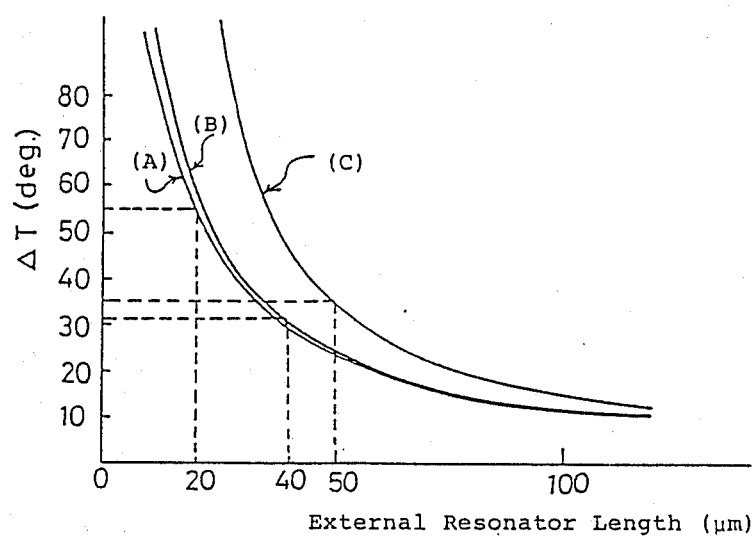
FIG. 4 is a graph showing the relationship between the external resonator length L and the temperature range $\Delta T$ in which a large mode hop is not produced.
Figure 5:
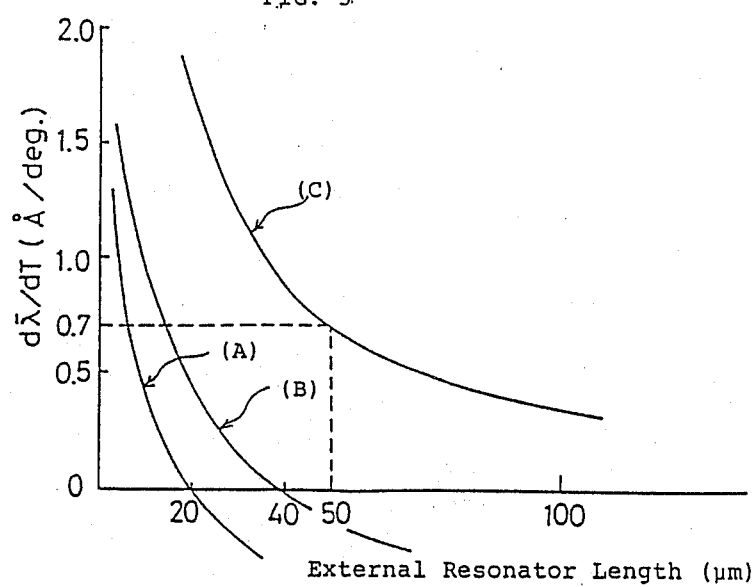
FIG. 5 is a graph showing the relationship between the external resonator length L and the temperature coefficient $d\bar\lambda/dT$ of the wavelength of the peak of the envelope of the axial mode spectrum.
Figure 6:
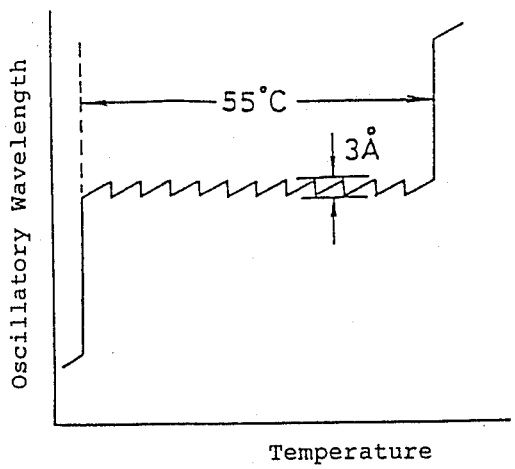
FIG. 6(a) is a graph showing a temperature characteristic of the oscillatory wavelength in a first embodiment.
FIG. 6(b) is a graph showing a temperature characteristic of the oscillatory wavelength in a second embodiment.
Figure 6:
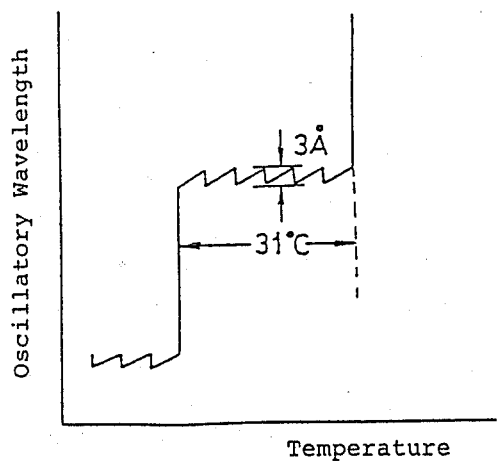
Figure 9:
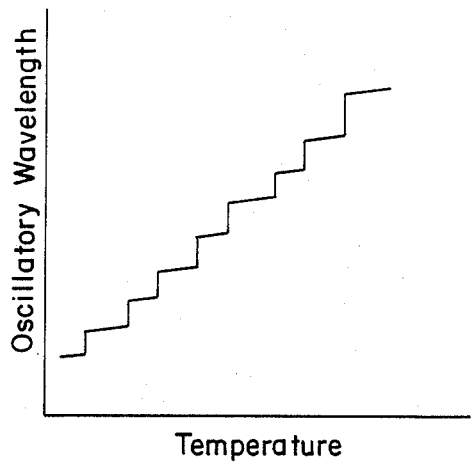
FIG. 9 is a graph showing a temperature characteristic of the oscillatory wavelength of a conventional semiconductor laser.

From A in FIG. 5, $d\bar{\lambda}/dT=0$ is obtained when L=20 μm, and then, from A in FIG. 4, $\Delta T=55°$ C. is obtained. Thus, it is confirmed that, by setting the external resonator length L to 20 μm, the temperature characteristic of the oscillatory wavelength of this embodiment becomes as shown in FIG. 6(a), i.e., the variation in width of the wavelength is kept within the wavelength spacing (3 Å) of the axial modes. B in FIG. 4 and B in FIG. 5 show results of measurement in a second embodiment which is of the same size as the above mentioned first embodiment excepting only that the length of the chip 2 is made to be Lb=250 μm. C in FIG. 4 and C in FIG. 5 show, for the sake of comparison, results of measurement in the case where Cu whose coefficient of linear expansion is $17.0 \times 10^{-6} \deg^{-1}$ is used as the material for the mount 4 in the second embodiment. In the second embodiment, $d\bar{\lambda}/dT=0$ is obtained when L=40 μm according to B in FIG. 5, and then $\Delta T=31°$ C. is obtained according to B in FIG. 4, and in this case, the temperature characteristic of the oscillatory wavelength becomes as shown in FIG. 6(b). The curve C in FIG. 5 shows that no external resonator length L gives $d\bar{\lambda}/dT=0$.

As apparent from the above, $d\bar{\lambda}/dT=0$ is achieved when the coefficient of linear expansion of the mount 4 is smaller than the coefficient of linear expansion of the semiconductor laser element 1 and chip 2, and at that time, the rate of variation of the external resonator length L with temperature is controllable also by the length of the chip 2 (or the semiconductor laser element 1), Lb (or La), and thereby, a wide temperature range $\Delta T$ can be established.

Although, the material for the chip 2 has been described to be GaAs in the above embodiments, the same effect can be obtained by using a material having a larger coefficient of linear expansion such as metal.

Further, by increasing the external resonator length, it becomes possible to obtain effects other than those above, i.e., to make the variation in width of the wavelength still smaller than 3 Å, because the axial mode spacing can then be made narrower.

What is claimed is:

1. An external resonator type semiconductor laser comprising:
   a mount member,
   a semiconductor laser element disposed on said mount member for emitting a laser beam from an emitting surface,
   a reflection member disposed on said mount member adjacent to said semiconductor laser element, said reflection member having a reflecting surface for feeding back to said semiconductor laser element a laser beam emitted from said emitting surface of said semiconductor laser element wherein the coefficient of linear expansion of said mount member is smaller than the coefficient of linear expansion of said semiconductor laser element and said reflection member so that the distance between said emitting surface and said reflecting surface decreases with a rise in temperature.

2. An external resonator type semiconductor laser according to claim 1, wherein said semiconductor laser element is a semiconductor laser having a GaAs-GaAlAs double heterojunction structure disposed on a GaAs substrate.

3. An external resonator type semiconductor laser according to claim 1, wherein said reflection member is made of GaAs and said reflecting surface comprises a total reflection mirror formed of an $Al_2O_3$ coating.

4. An external resonator type semiconductor laser according to claim 2, wherein said mount member comprises silicon which has a coefficient of linear expansion smaller than the coefficient of linear expansion of the GaAs $(5.9 \times 10^{-6} \deg^{-1})$ as the material in said semiconductor laser element.

5. An external resonator type semiconductor laser according to claim 4, wherein said reflection member is made of GaAs and said reflecting surface comprises a total reflection mirror formed of an $Al_2O_3$ coating.

6. An external resonator type semiconductor laser according to claim 5, wherein the coefficient of linear expansion of said mount member is $2.4 \times 10^{-6} \deg^{-1}$ and of the GaAs material in said semiconductor laser element is $5.9 \times 10^{-6} \deg^{-1}$.

7. An external resonator type semiconductor laser according to claim 2, wherein said semiconductor laser comprises:
   a substrate;

a current limiting layer formed on said substrate, wherein a groove for a current path is formed through said current limiting layer into said substrate;

a first clad layer formed on said current limiting layer;

an active layer formed on said first clad layer;

a second clad layer formed on said active layer;

a cap layer formed on said second clad layer; and first and second electrodes formed on said substrate and said cap layer, respectively.

8. An external resonator type semiconductor laser according to claim 2, wherein the variation of width of the oscillatory wavelength of said laser is 3 angstroms or less.

9. An external resonator type semiconductor laser according to claim 5, wherein the variation of width of the oscillatory wavelength of said laser is 3 angstroms or less.

10. An external resonator type semiconductor laser according to claim 5, wherein said semiconductor laser comprises:

a substrate;

a current limiting layer formed on said substrate, wherein a groove for a current path is formed through said current limiting layer into said substrate;

a first clad layer formed on said current limiting layer;

an active layer formed on said first clad layer;

a second clad layer formed on said active layer;

a cap layer formed on said second clad layer; and first and second electrodes formed on said substrate and said cap layer, respectively.

* * * * *